(12) United States Patent
Li et al.

(10) Patent No.: US 12,220,730 B2
(45) Date of Patent: Feb. 11, 2025

(54) CLAMPING DEVICE AND CLEANING DEVICE

(71) Applicant: TRIPLE WIN TECHNOLOGY(SHENZHEN) CO.LTD., Shenzhen (CN)

(72) Inventors: Liang-Yuan Li, Shenzhen (CN); Lian-Jie Tan, Shenzhen (CN); Yuan Wen, Shenzhen (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 372 days.

(21) Appl. No.: 17/828,279

(22) Filed: May 31, 2022

(65) Prior Publication Data

US 2022/0388045 A1  Dec. 8, 2022

(30) Foreign Application Priority Data

Jun. 2, 2021 (CN) .......................... 202121220767.7

(51) Int. Cl.
   *B25B 11/00* (2006.01)
   *B08B 11/02* (2006.01)
   *H01L 21/687* (2006.01)

(52) U.S. Cl.
   CPC ........ *B08B 11/02* (2013.01); *H01L 21/68721* (2013.01)

(58) Field of Classification Search
   CPC .......... B25B 5/14; B25B 1/2452; B25B 5/00; B25B 11/00; H01L 21/68721
   See application file for complete search history.

(56) References Cited

U.S. PATENT DOCUMENTS

| | | | | |
|---|---|---|---|---|
| 724,116 | A * | 3/1903 | Maley | B41F 27/04 411/398 |
| 2,430,613 | A * | 11/1947 | Hodge | B25B 5/08 269/142 |
| 5,961,107 | A * | 10/1999 | Morghen | B25B 5/163 269/305 |
| 6,652,656 | B2 * | 11/2003 | Kopacz | H01L 21/68721 118/503 |
| 6,682,295 | B2 * | 1/2004 | Blank | H01L 21/68 414/757 |
| 2022/0388045 | A1 * | 12/2022 | Li | B08B 11/02 |

* cited by examiner

*Primary Examiner* — Lee D Wilson
(74) *Attorney, Agent, or Firm* — ScienBiziP, P.C.

(57) ABSTRACT

A clamping device for clamping silicon wafers of different sizes and cleaning same includes a main body and a plurality of clamping mechanisms. The surface of the main body defines a plurality of receiving grooves. Separate circular and concentric rows of clamping mechanisms are radially disposed around a central axis of the main body. The clamping mechanism includes first and second clamping members each received in one of the receiving grooves and are adjustable in respect of working height above or flush with the carrying surface of the main body. The first clamping member is closer to the center axis with respect to the second clamping member. A cleaning device with the clamping device is also disclosed.

17 Claims, 4 Drawing Sheets

CLAMPING DEVICE AND CLEANING DEVICE

FIELD

The subject matter herein generally relates to semiconductor technology, and more particularly to a clamping device for clamping wafers and a cleaning device with the clamping device.

BACKGROUND

In process for cleaning wafers, the wafers are generally clamped in a clamping device and cleaned by a cleaning device. However, when wafers of different sizes need to be cleaned, different clamping devices are needed, which increases the difficulty of cleaning and reduces the working efficiency.

BRIEF DESCRIPTION OF THE DRAWINGS

Implementations of the present disclosure will now be described, by way of embodiments, with reference to the attached figures.

DETAILED DESCRIPTION

Figure 1:
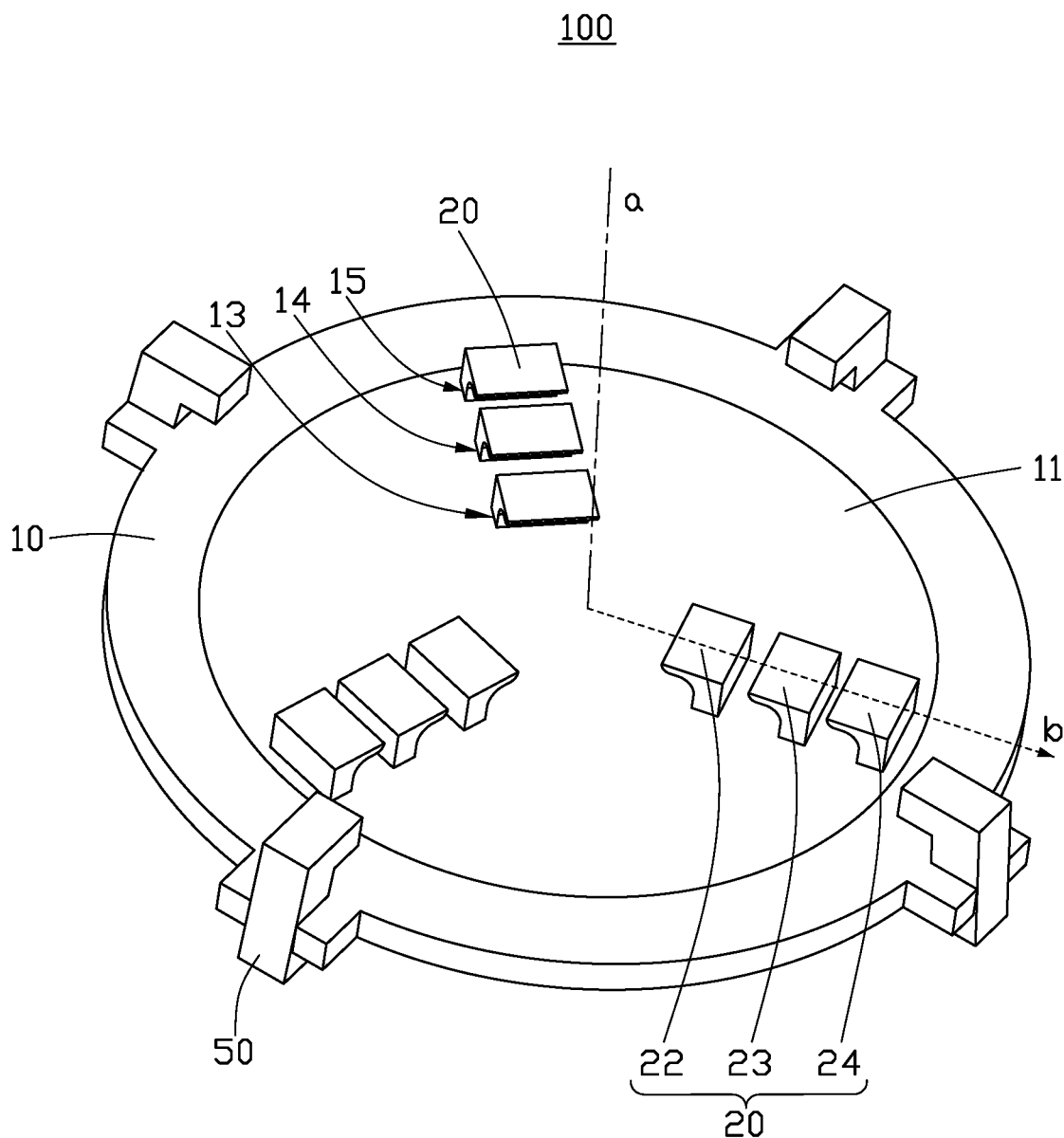
FIG. 1 is a diagrammatic view of an embodiment of a clamping device according to the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

Figure 4:
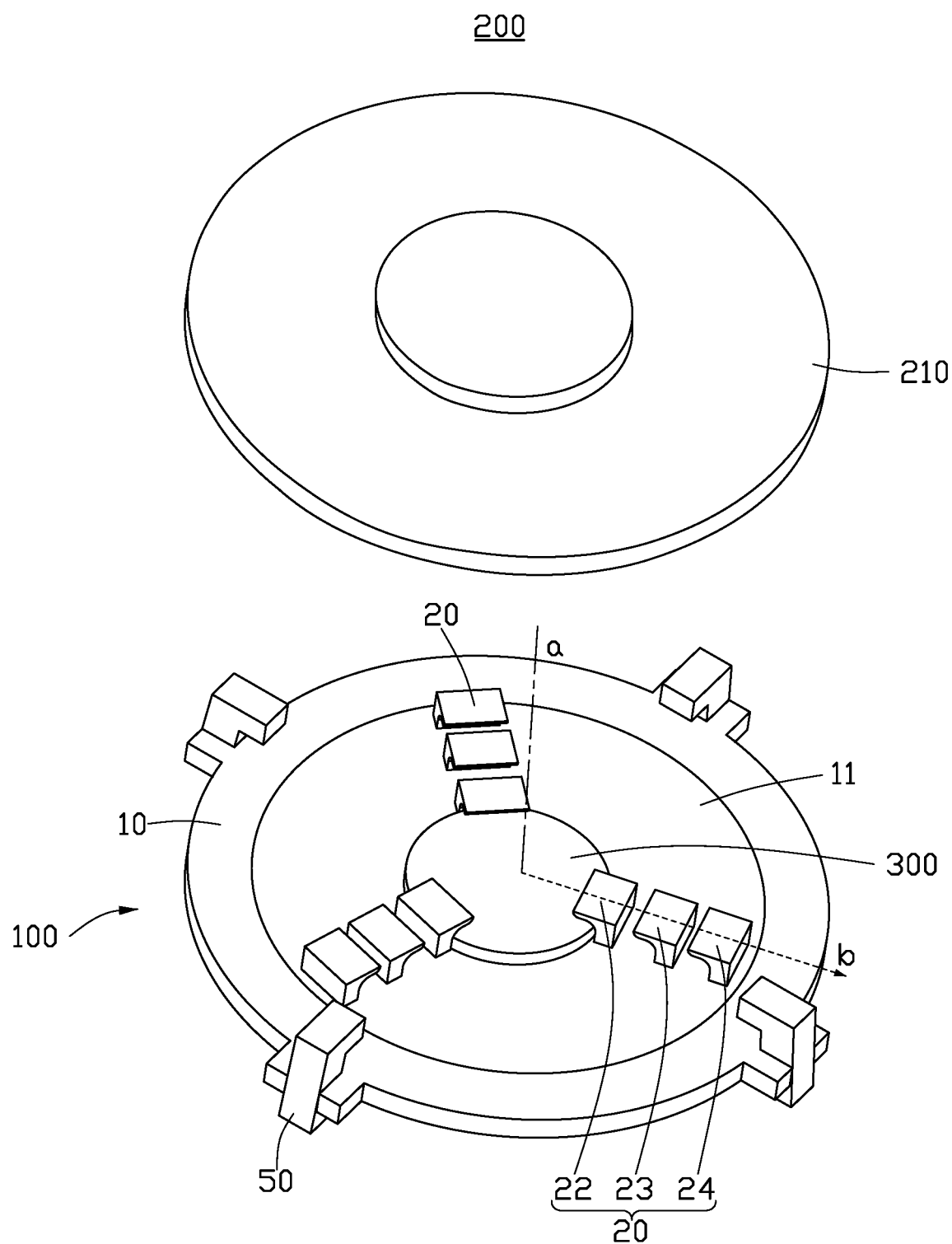
FIG. 4 is a diagrammatic view of an embodiment of a cleaning device according to the present disclosure.

FIG. 1 shows an embodiment of a clamping device 100. The clamping device 100 is used to clamp wafers of silicon or other materials ("workpieces"), and the workpieces are cleaned in the clamping device 100 by a cleaning mechanism 210 (as shown in FIG. 4). The workpieces are, but not limited to, wafers. The clamping device 100 includes a main body 10 and a plurality of clamping mechanisms 20.

The main body 10 is substantially disc-shaped. The main body 10 defines a carrying surface 11, which is used to support the workpieces. Clamping mechanisms 20 are spaced apart from each other around a central axis (defined as "a") of the main body 10. Each clamping mechanism 20 includes a first clamping member 22, a second clamping member 23, and a third clamping member 24. The first clamping member 22, the second clamping member 23, and the third clamping member 24 are spaced apart from each other, and arranged in that radial order along a radial direction (defined as "b") of the main body 10. The clamping mechanism 20 can clamp workpieces of different sizes, thereby a working efficiency and an adaptability of the clamping device 100 are improved.

In an embodiment, a radius of the main body 10 is twelve inches. The first clamping member 22 is disposed at a first position 13, which is four inches from the center axis "a" of the main body 10. The first clamping member 22 is used to clamp the workpiece of four inches. The second clamping member 23 is disposed at a second position 14, which is six inches from the center axis "a" of the main body 10. The second clamping member 23 is used to clamp the workpiece of six inches. The third clamping member 24 is disposed at a third position 15, which is eight inches from the center axis "a" of the main body 10. The third clamping member 24 is used to clamp the workpiece of eight inches. The size of the body 10 can also be changed according to actual uses. The positions of the first clamping member 22, the second clamping member 23, and the third clamping member 24 can also be changed according to the workpieces of actual sizes.

Figure 2:
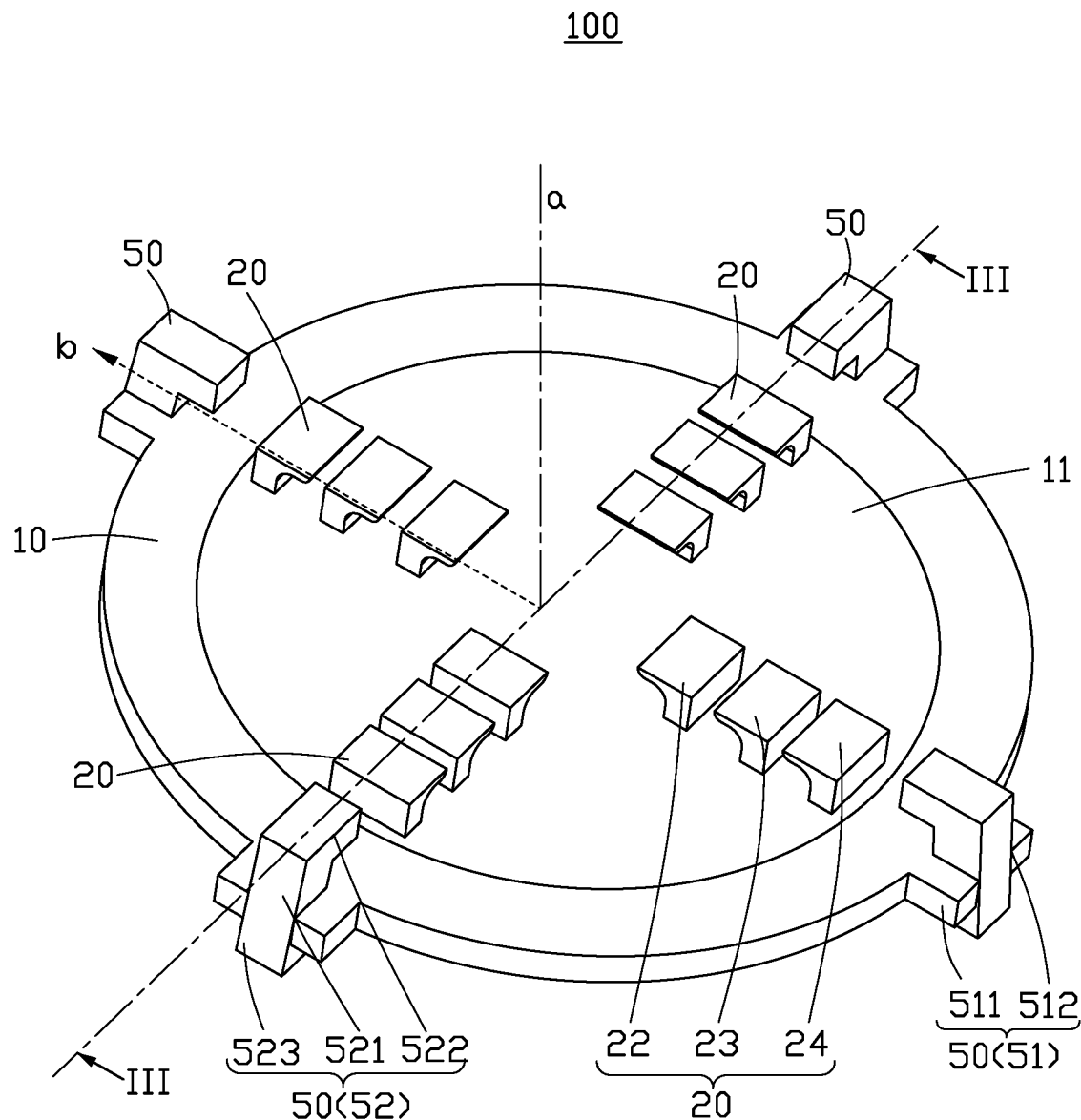
FIG. 2 is a diagrammatic view of another embodiment of a clamping device according to the present disclosure.

Referring to FIG. 2, in an embodiment, the clamping device 100 includes four clamping mechanisms 20. The four clamping mechanisms 20 are spaced apart from each other around the central axis of the main body 10. Two of the four clamping mechanisms 20 are arranged at two opposite sides of the center axis "a", and are axisymmetric with each other. Thereby, the clamping stability of the workpieces of different sizes is improved, and the adaptability of the clamping device 100 is also improved.

Figure 3:
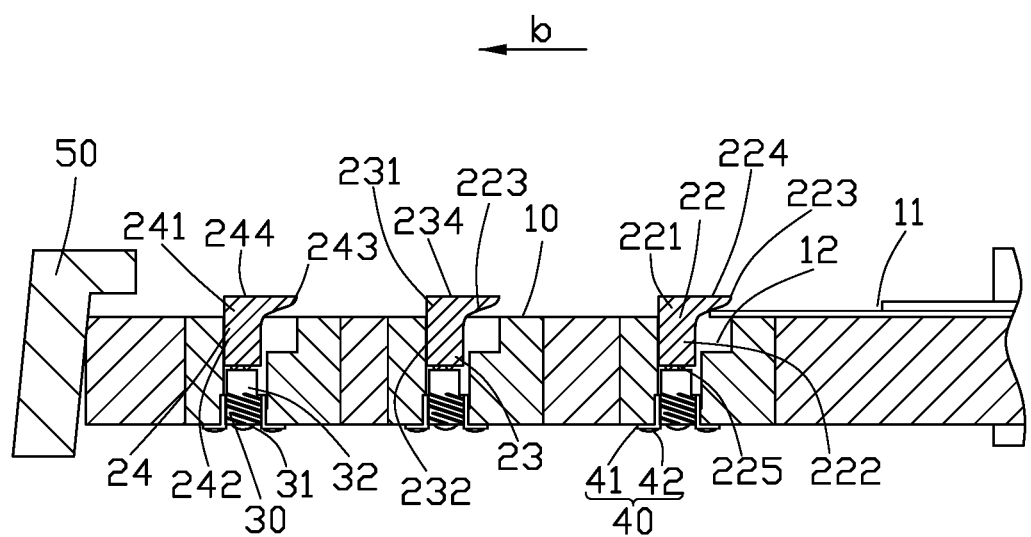
FIG. 3 is a cross-sectional view taken along line in FIG. 2.

Referring to FIG. 3, the carrying surface 11 defines a plurality of receiving grooves 12. The first clamping member 22, the second clamping member 23, and the third clamping member 24 are movably disposed in a receiving groove 12. The first clamping member 22 is closer to the central axis "a" of the main body 10 relative to the second clamping member 22. The first clamping member 22, the second clamping member 23, and the third clamping member 24 have a same structure. Taking the first clamping member 22 as an example, the first clamping member 22 includes a first clamping portion 221 and a first sliding portion 222 connected to the first clamping portion 221. The first sliding portion 222 is movably arranged in the receiving grooves 12. The first clamping portion 221 is disposed on an end of the first sliding portion 222 close to the carrying surface 11. The first clamping portion 221 can extend out of the receiving grooves 12. The first clamping portion 221 defines a first clamping surface 223 and a first supporting surface 224 connected to the first clamping surface 223. The first clamping surface 223 is substantially arcuate. The first clamping surface 223 matches a clamping portion of the workpiece in shape, to prevent the workpiece being scratched when the first clamping surface 223 clamps the workpiece. Along a radial direction "b" of the main body 10, a size of the first supporting surface 224 is smaller than that of the receiving groove 12. Thus, the first clamping portion 221 of each first clamping member 22 can be driven in a direction parallel to the center axis "a" of the main body 10, until the first support surface 224 is flush with the carrying surface 11. Thereby, the clamping device 100 can clamp workpieces of different sizes and the adaptability and working efficiency of the clamping device 100 are improved.

When the clamping device 100 clamps the workpiece of a first size, the carrying surface 11 carries a workpiece of the first size. The first sliding portion 222 and the first clamping portion 221 are driven along the direction parallel to the center axis "a", so that the first clamping surface 223 clamps the workpiece of the first size.

The second clamping portion 23 includes a second clamping portion 231 and a second sliding portion 232 connected to the second clamping portion 231. The second clamping portion 231 defines a second clamping surface 233 and a second supporting surface 234 connected to the second clamping surface 233. When the second clamping portion 23 clamps a workpiece of a second size, the first sliding portion 222 is driven downwards along the direction parallel to the center axis "a" to make the first support surface 224 be in a same plane with the carrying surface 11, to carry the workpiece of the second size. Then, the second sliding portion 232 and the second clamping portion 231 are driven along the direction parallel to the center axis "a", so that the second clamping surface 233 clamps the workpiece of the second size.

The third clamping portion 24 includes a third clamping portion 241 and a third sliding portion 242. The third clamping portion 241 defines a third clamping surface 243 and a third supporting surface 244 connected to the third clamping surface 243. When the third clamping portion 24 clamps a workpiece of a third size, the carrying surface 11, the first supporting surface 224, and the second supporting surface 234 are in a same plane to carry the workpiece of the third size. The third sliding portion 242 and the third clamping portion 241 are driven along the direction parallel to the center axis "a", so that the third clamping surface 243 clamps the workpiece of the third size.

Referring to FIG. 3, the clamping device 100 further includes a plurality of adjusting members 30. The adjusting member 30 is substantially cylindrical. The adjusting members 30 are movably disposed in the receiving grooves 12. One adjusting member 30 is detachably connected to one end of the first clamping member 22 away from the carrying surface 11. Another adjusting member 30 is detachably connected to one end of the second clamping member 23 away from the carrying surface 11. Yet another adjusting member 30 is detachably connected to one end of the third clamping member 24 away from the carrying surface 11. A first connecting member 225 is disposed at one end of each of the first clamping member 22, the second clamping member 23, and the third clamping member 24 adjacent to the adjusting member 30. The first connecting member 225 is a cylindrical magnet. A second connecting member 32 is disposed at one end of each adjusting member 30 adjacent to the carrying surface 11. The second connecting member 32 is a cylindrical metal block. The first connecting member 225 and the second connecting member 32 are magnetically drawn to each other, so that the first connecting member 225 can be detachably connected to the second connecting member 32.

In use, processes of clamping the workpieces of different sizes by the clamping device 100 are substantially the same. Taking the workpiece of the first size as an example. When clamping the workpiece of the first size, the first sliding portion 222 is moved downwards to compress the adjusting member 30, so as to reset the first clamping portion 221. Then the first clamping portion 221 is moved away from the receiving groove 12 to separate the first connecting member 225 from the second connecting member 32. After the workpiece of the first size is placed on the carrying surface 11, the first clamping portion 221 is placed in the receiving groove 12 to allow the first connecting member 225 to magnetically attract the second connecting member 32, so that the first clamping surface 223 clamps the workpiece of the first size.

In an embodiment, the adjusting member 30 may be, but not limited to, a rebound device or a spring.

In other embodiments, the first connecting member 225 is a snap-fit portion (not shown), and the second connecting member 32 is a cavity (not shown) for a snap fitting. The first connecting member 225 and the second connecting member 32 are snap-fitted together for removing or installing the first clamping portion 221, so that the first clamping surface 223 clamps the workpiece.

Referring to FIG. 3, the clamping device 100 further includes a plurality of fixing members 40. The fixing member 40 includes a fixing portion 41 and a connecting portion 42. The fixing portion 41 is substantially a circular structure. The connecting portion 42 is substantially a cylindrical structure. A part of the connecting portion 42 is received in one end of the receiving groove 12 away from the carrying surface 11. Another part of the connecting portion 42 is connected to the fixing portion 41. The fixing portion 41 is disposed on one side of the main body 10 away from the carrying surface 11 to fix the connecting portion 42 on the main body 10. The connecting portion 42 defines an accommodation cavity. An inner wall of the accommodation cavity is provided with internal threads, and an end of the adjusting member 30 away from the carrying surface 11 is provided with external threads 31. The adjusting member 30 is screwed to the fixing member 40. The adjusting member 30 can drive the first sliding portion 222 to move along the direction parallel to the center axis "a", so that the first sliding portion 222 and the first clamping portion 221 are moved, thereby the first support surface 224 is in the same plane with the carrying surface 11. Thus, the clamping device 100 can clamp workpieces of different sizes, and the adaptability and working efficiency of the clamping device 100 are improved.

In other embodiments, the inner wall of the accommodation cavity is provided with a slide rail (not shown) or a slide groove (not shown). The slide rail or the slide groove extends along a moving direction of the adjusting member 30. The end of the adjusting member 30 away from the first clamping portion 221 is provided with a slide rail (not shown) or slide groove (not shown). The slide rail or groove extends along the moving direction of the adjusting member 30. The slide rail of the accommodation cavity is slidably connected to the slide groove of the adjusting member 30. Or, the slide groove of the accommodation cavity is slidably connected to the slide rail of the adjusting member 30. The adjusting member 30 drives the first sliding portion 222 to move along the direction parallel to the center axis "a", so that the first sliding portion 222 and the first clamping portion 221 are moved, thereby the first support surface 224 is in the same plane with the carrying surface 11. Thus, the clamping device 100 can clamp workpieces of different sizes, and the adaptability and working efficiency of the clamping device 100 are improved.

Referring to FIG. 3, the clamping device 100 further includes a plurality of supporting members 50, which are spaced around the central axis of the main body 10 and disposed on a peripheral edge of the main body 10. The supporting members 50 include a fixed plate 51 and a claw 52. The fixed plate 51 is disposed on the peripheral edge of the main body 10. The fixed plate 51 includes a first fixed plate 511 and a second fixed plate 512 opposite to the first fixed plate 511. Structures of the first fixed plate 511 and the second fixed plate 512 are substantially lamellar. The claw 52 is substantially disposed between the first fixed plate 511 and the second fixed plate 512. When the main body 10 rotates, the claw 52 can be driven to rotate to clamp the workpieces.

The claw 52 includes a connecting plate 521, a holding portion 522, and a rotating portion 523. One end of the connecting plate 521 is connected to the holding portion 522, and other end of the connecting plate 521 is connected to the rotating portion 523. The holding portion 522 is substantially a rectangular structure. The rotating portion 523 is substantially a square structure. A mass of the rotating portion 523 is greater than that of the holding portion 522. When the main body 10 rotates, the rotating portion 523 is thrown along the direction parallel to the center axis "a" of the clamping device 100 due to a centrifugal force. The rotating portion 523 rotates from a side of the main body 10 away from the carrying surface 11 to other side of the main body 10 adjacent to the carrying surface 11, so as to drive the supporting portion 522 inwards and onto a surface of the workpiece and further clamp the workpiece to prevent the workpiece from slipping.

In use, when clamping the workpiece of the first size, the first sliding portion 222 is moved along the direction parallel to the center axis "a", and the adjusting member 30 resets the first clamping portion 221. The first clamping portion 221 is moved from the receiving groove 12 to separate the sliding portion 222 from the adjusting member 30. After placing the workpiece of the first size on the carrying surface 11, the first clamping portion 221 is moved into the receiving groove 12. Thus, the first connecting member 225 and the second connecting member 32 are magnetically attracted to each other to clamp the first clamping surface 223 onto the workpiece of the first size. When clamping the workpiece of the second size, the adjusting member 30 is moved along the direction parallel to the center axis "a", so that the first support surface 224 is in the same plane with the carrying surface 11. After placing the workpiece of the second size on the carrying surface 11, the second clamping member 23 is moved, so that the second clamping surface 233 clamps the workpiece of the second size. When clamping the workpiece of the third size, the adjusting member 30 is moved along the direction parallel to the center axis "a", so that the carrying surface 11, the first support surface 224, and the second support surface 234 are in the same plane. After placing the workpiece of the third size on the bearing surface 11, the third clamping member 24 is moved, so that the third clamping surface 233 clamps the workpiece of the third size. When clamping the workpiece of the fourth size, the adjusting member 30 is moved along the direction parallel to the center axis "a", so that the carrying surface 11, the first support surface 224, the second support surface 234, and the third support surface 244 are in the same plane. After placing the workpiece of the fourth size on the main body 10, the supporting member 50 clamps the workpiece.

The clamping device 100 clamps the workpieces through the carrying surface 11. The first clamping member 22, the second clamping member 23, and the third clamping member 24 can clamp the workpieces of different sizes. The operation of the clamping process of the clamping device 100 is simple. Through the first clamping member 22, the second clamping member 23, and the third clamping member 24 clamping the workpieces of different sizes, the adaptability and working efficiency of the clamping device 100 are improved.

FIG. 4 illustrates a cleaning device 200 according to the present disclosure. The cleaning device 200 includes the clamping device 100 and a cleaning mechanism 210 disposed above the clamping device 100. The cleaning mechanism 210 is used to clean the workpieces of different sizes when such workpieces are clamped on the clamping device 100. In an embodiment, the workpieces are wafers.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A clamping device comprising:
a main body comprising a carrying surface configured to carry workpieces, the carrying surface defining a plurality of receiving grooves;
a plurality of clamping mechanisms spacing apart from each other and disposing around a central axis of the main body, each of the plurality of clamping mechanisms comprising a first clamping member and a second clamping member each received in one of the plurality of receiving grooves, wherein the first clamping member and the second clamping member are spaced apart from each other, and arranged in that order along a radial direction of the main body, the first clamping member is closer to the center axis with respect to the second clamping member, at least the first clamping member is configured to move along a direction perpendicular to the carrying surface, causing each of the plurality of clamping mechanisms to clamp the workpieces of different sizes; and
a plurality of supporting members, wherein the plurality of supporting members is spaced apart from each other around the central axis of the main body, and disposed on a peripheral edge of the main body, each of the plurality of supporting members comprises a fixed plate and a claw, a side of the fixed plate is connected to the main body, another side of the fixed plate is rotatory connected to the claw, the main body is configured to drive the claw to rotate and support the workpiece.

2. The clamping device of claim 1, comprising four clamping mechanisms spaced around the central axis of the main body, wherein two of the four clamping mechanisms are arranged at two opposite sides of the center axis, and are axisymmetric with each other.

3. The clamping device of claim 1, wherein each of the plurality of clamping mechanisms further comprises a third clamping member, the first clamping member, the second clamping member, and the third clamping member are spaced apart from each other and arranged in that order along the radial direction, each of the second clamping member and the third clamping member is configured to move along the direction perpendicular to the carrying surface.

4. The clamping device of claim 3, wherein the first clamping member comprises a first clamping portion and a first sliding portion connected to the first clamping portion, the first clamping portion comprises a first clamping surface and a first supporting surface adjacent to the first clamping surface, the first clamping member is configured to clamp one of the workpieces of a first size, the first sliding portion and the first clamping portion are driven to move along the direction perpendicular to the carrying surface, causing the first clamping surface to clamp the workpiece of the first size.

5. The clamping device of claim 4, wherein the second clamping portion comprises a second clamping portion and a second sliding portion connected to the second clamping portion, the second clamping portion comprises a second clamping surface and a second supporting surface adjacent to the second clamping surface, the second clamping portion is configured to clamp one of the workpieces of a second size, the second sliding portion and the second clamping portion are driven to move along the direction perpendicular to the carrying surface, causing the second clamping surface to clamp the workpiece of the second size.

6. The clamping device of claim 5, wherein the third clamping portion comprises a third clamping portion and a third sliding portion, the third clamping portion comprises a third clamping surface and a third supporting surface adjacent to the third clamping surface, the third clamping portion is configured to clamp one of the workpieces of a third size, the carrying surface, the third sliding portion and the third clamping portion are driven to move along the direction perpendicular to the carrying surface, causing the third clamping surface to clamp the workpiece of the third size.

7. The clamping device of claim 6, wherein each of the first clamping surface, the second clamping surface, and the third clamping surface are arcuate;

along the radial direction, each of a size of the first supporting surface, a size of the second supporting surface, and a size of the third supporting surface is smaller than a size of each of the plurality of receiving grooves.

8. The clamping device of claim 6, further comprising a plurality of adjusting members, the plurality of adjusting members is movably disposed in the plurality of receiving grooves, one of the plurality of adjusting members is detachably connected to one end of the first clamping member away from the carrying surface, another one of the plurality of adjusting members is detachably connected to one end of the second clamping member away from the carrying surface, another one of the plurality of adjusting members is detachably connected to one end of the third clamping member away from the carrying surface, the plurality of adjusting members is configured to adjust positions of the first clamping member, the second clamping member, and the third clamping member.

9. The clamping device of claim 6, wherein a first connecting member is disposed at one end of each of the first sliding portion, the second sliding portion, and the third sliding portion away from the carrying surface, a second connecting member is disposed at one end of each one of the plurality of adjusting members adjacent to the carrying surface, the first connecting member is detachably connected to the second connecting member.

10. The clamping device of claim 8, further comprising a plurality of fixing members, wherein each of the plurality of fixing members comprises a fixing portion and a connecting portion, a part of the connecting portion is received in one end of one of the plurality of receiving grooves away from the carrying surface, another part of the connecting portion is connected to the fixing portion, the fixing portion is configured to fix the connecting portion, the fixing portion and the adjusting member are threadedly connected to each other.

11. The clamping device of claim 1, wherein the fixed plate comprises a first fixed plate and a second fixed plate opposite to the first fixed plate, the claw is disposed between the first fixed plate and the second fixed plate.

12. The clamping device of claim 1, wherein the claw comprises a connecting plate, a holding portion, and a rotating portion, one end of the connecting plate is connected to the holding portion, and another end of the connecting plate is connected to the rotating portion, the main body is configured to drive the rotating portion to rotate along the axial direction, driving the supporting portion to rotate to a surface of the workpiece and clamp the workpiece.

13. The clamping device of claim 12, wherein a mass of the rotating portion is greater than a mass of the holding portion.

14. A cleaning device comprising:
a clamping device comprising:
    a main body comprising a carrying surface configured to carry workpieces, the carrying surface defining a plurality of receiving grooves; and
    a plurality of clamping mechanisms spacing apart from each other and disposing around a central axis of the main body, each of the plurality of clamping mechanisms comprising a first clamping member and a second clamping member each received in one of the plurality of receiving grooves, wherein the first clamping member and the second clamping member are spaced apart from each other, and arranged in that order along a radial direction of the main body, the first clamping member is closer to the center axis with respect to the second clamping member, at least the first clamping member is configured to move along a direction perpendicular to the carrying surface, causing each of the plurality of clamping mechanisms to clamp the workpieces of different sizes;
    a plurality of fixing members, wherein each of the plurality of fixing members comprises a fixing portion and a connecting portion, a part of the connecting portion is received in one end of one of the plurality of receiving grooves away from the carrying surface, another part of the connecting portion is connected to the fixing portion, the fixing portion is configured to fix the connecting portion, the fixing portion and the adjusting member are threadedly connected to each other; and
    a plurality of supporting members, wherein the plurality of supporting members is spaced apart from each other around the central axis of the main body, and disposed on a peripheral edge of the main body, each of the plurality of supporting members comprises a fixed plate and a claw, a side of the fixed plate is connected to the main body, another side of the fixed plate is rotatory connected to the claw, the main body is configured to drive the claw to rotate and clamp the workpiece; and a cleaning mechanism disposed above the clamping device, wherein the cleaning mechanism is configured to cleaning the workpieces of different sizes clamping on the clamping device.

15. The cleaning device of claim 14, wherein the clamping device comprises four clamping mechanisms spaced around the central axis of the main body, two of the four clamping mechanisms are arranged at two opposite sides of the center axis, and are axisymmetric with each other.

16. The cleaning device of claim 14, wherein each of the plurality of clamping mechanisms further comprises a third clamping member, the first clamping member, the second clamping member, and the third clamping member are spaced apart from each other and arranged in that order along the radial direction, each of the second clamping member and the third clamping member is configured to move along the direction perpendicular to the carrying surface.

17. The cleaning device of claim 16, wherein the clamping device further comprises a plurality of adjusting members, the plurality of adjusting members is movably disposed in the plurality of receiving grooves, one of the plurality of adjusting members is detachably connected to one end of the first clamping member away from the carrying surface, another one of the plurality of adjusting members is detachably connected to one end of the second clamping member away from the carrying surface, another one of the plurality of adjusting members is detachably connected to one end of the third clamping member away from the carrying surface, the plurality of adjusting members is configured to adjust positions of the first clamping member, the second clamping member, and the third clamping member.

* * * * *